United States Patent
Zhang et al.

(10) Patent No.: US 9,508,720 B1
(45) Date of Patent: Nov. 29, 2016

(54) LOW LEAKAGE FINFET

(71) Applicant: Altera Corporation, San Jose, CA (US)

(72) Inventors: Weimin Zhang, San Jose, CA (US); Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/677,448

(22) Filed: Apr. 2, 2015

(51) Int. Cl.
*H01L 29/78* (2006.01)
*H01L 29/66* (2006.01)
*H01L 27/092* (2006.01)
*H01L 21/8238* (2006.01)
*H01L 29/165* (2006.01)
*H01L 29/16* (2006.01)

(52) U.S. Cl.
CPC ... *H01L 27/0924* (2013.01); *H01L 21/823814* (2013.01); *H01L 29/165* (2013.01); *H01L 29/1608* (2013.01)

(58) Field of Classification Search
CPC ............ H01L 29/785; H01L 29/7856; H01L 29/7658; H01L 29/786
USPC ................................................. 257/347–369
See application file for complete search history.

(56) References Cited

U.S. PATENT DOCUMENTS

2014/0284723 A1* 9/2014 Lee .................. H01L 29/66795
257/369

OTHER PUBLICATIONS

K. J. Kuhn, "Past, Present and Future: SiGe and CMOS Transistor Scaling," Intel Corporation, Logic Technology Development, Hillsboro, OR, Electrochemical Society, Oct. 2010, pp. 1-15.

\* cited by examiner

*Primary Examiner* — Cuong Q Nguyen (57) ABSTRACT

An illustrative finFET comprises first, second, and third pluralities of fins having gate structures and source and drain regions formed on the fins so that first PMOS transistors are formed in first epitaxial regions on the first plurality of fins, NMOS transistors are formed in second epitaxial regions on the second plurality of fins and second PMOS transistors are formed in third epitaxial regions on the third plurality of fins. In three embodiments, the fins are formed in silicon; the first epitaxial region is silicon germanium; the second region is silicon; and the third region is 1) silicon, 2) silicon carbide, or 3) silicon or silicon carbide on a silicon carbide cladding. In another embodiment, the third epitaxial regions are wide band gap semiconductors formed on wide band gap semiconductor fins. In another embodiment, all the fins and epitaxial regions are wide band gap semiconductors.

25 Claims, 9 Drawing Sheets

LOW LEAKAGE FINFET

BACKGROUND

This relates to semiconductor devices such as finFETs (Fin Field Effect Transistors). FinFETs are also referred to sometimes as multiple-gate, double-gate or tri-gate transistors.

FinFETs have been developed to obtain larger gate widths A fin is a thin segment of semiconductor material standing on edge, thereby making available multiple surfaces for the formation of gate structures. The fins have first and second major surfaces that are opposite one another and usually are symmetric about a center plane that bisects the fin lengthwise. The major surfaces are often illustrated as being parallel as in U.S. Pat. No. 7,612,405 B2 or Pub. No. US2008/0128797 A1, which are incorporated herein by reference; but process limitations usually result in surfaces that slope outwardly from top to bottom of the fin with the result that the cross-section of the fin is trapezoidal in shape. In some cases, the two major surfaces meet at the top. In some embodiments, a separate gate structure may be located on each surface of each fin. In other embodiments, there is a common gate structure for all surfaces.

Doped source and drain regions are located on opposite sides of the gates. As in a planar FET, a voltage applied to the gate controls current flow in a channel that extends between the doped source and drain regions in the semiconductor beneath the gate.

Further details on finFETs may be found at pages 137-138 of N. H. E. Weste and D. Harris, CMOS VLSI Design (Pearson, $3^{rd}$ ed., 2005) which are incorporated herein by reference.

One application of finFETs is in the memory cells of a static random access memory (SRAM). The basic structure of a SRAM memory cell is a latch having a first pair of series-connected PMOS and NMOS transistors cross-coupled with a second pair of series-connected PMOS and NMOS transistors and two NMOS pass transistors for connecting the latch to two bit lines. It is highly desirable to use finFETs to implement the PMOS and NMOS transistors in such cells to take advantage of the small size and high switching speeds of the finFETs. However, when conventional SRAM finFETs are implemented in silicon germanium, the PMOS finFETs are observed to have high DC leakage. High leakage currents not only degrade the operation of the finFET but also produce excessive heating of the semiconductor chip in which the PMOS transistors are formed. This is especially troublesome in circuits where large numbers of PMOS transistors are used such as the configuration random access memory (CRAM) circuits of field programmable gate arrays (FPGAs) that may include millions of memory cells.

SUMMARY

The present invention provides finFETs with different switching speeds and methods for manufacturing such devices.

An illustrative finFET of the present invention comprises first, second, and third pluralities of fins having gate structures and source and drain regions formed on the fins so that first PMOS transistors are formed on the first plurality of fins, NMOS transistors are formed on the second plurality of fins and second PMOS transistors are formed on the third plurality of fins. In a first embodiment, the first PMOS transistors are formed in silicon germanium regions that are grown epitaxially on the first plurality of fins, the NMOS transistors are formed in silicon regions that are grown epitaxially on the second plurality of fins, and the second PMOS transistors are formed in silicon regions that are grown epitaxially on the third plurality of fins.

In a second embodiment, the first PMOS transistors are formed in silicon germanium regions that are grown epitaxially on the first plurality of fins, the NMOS transistors are formed in silicon regions that are grown epitaxially on the second plurality of fins; and the second PMOS transistors are formed in silicon carbide regions that are grown epitaxially on the third plurality of fins.

In a third embodiment, the first PMOS transistors and the NMOS transistors are again formed in silicon germanium regions and silicon regions, respectively, that are grown epitaxially on the first and second pluralities of fins; and the second PMOS transistors are formed in silicon or silicon carbide regions that are grown epitaxially on a silicon carbide cladding region that is grown epitaxially on the third plurality of fins.

In a fourth embodiment, the first PMOS transistors and the NMOS transistors are again formed in silicon germanium regions and silicon regions, respectively, that are grown epitaxially on the first and second pluralities of fins; and the second PMOS transistors are formed in regions of a wide band gap semiconductor material that are grown epitaxially on the third plurality of fins which is also made of a wide band gap semiconductor material.

In each of these embodiments, we have found that the second PMOS transistors formed in accordance with the invention have leakage currents that are significantly lower than the leakage current of similar silicon germanium PMOS finFET transistors.

One application for the finFETs described above is in field programmable gate arrays (FPGAS) where static RAM cells are used in CRAM to store the configuration bits that program the logic elements and switching circuitry of the FPGA. By using two types of PMOS finFET transistors, transistors such as the first PMOS transistors can be optimized for high speed operation; and transistors such as the second PMOS transistors can be optimized for low leakage and used in the CRAM where speed of operation is not as demanding.

In a fifth embodiment, the first and second pluralities of fins are formed in an epitaxially grown wide band semiconductor material and first and second epitaxial regions of a wide band gap semiconductor material are formed on the fins. PMOS transistors are formed in the first epitaxial regions on the first plurality of fins; and NMOS transistors are formed in the second epitaxial regions on the second plurality of fins.

Various ways to form the fins of the finFETs of these five embodiments will be described below. Illustratively, transistors are formed on the fins by forming a gate structure on the fins, forming epitaxial regions on the fins, and then using ion implantation of N-type dopants to form the source and drain regions of the NMOS transistors and ion implantation of P-type dopants to form the source and drain regions of the PMOS transistors.

Numerous variations may be practiced in the preferred embodiment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
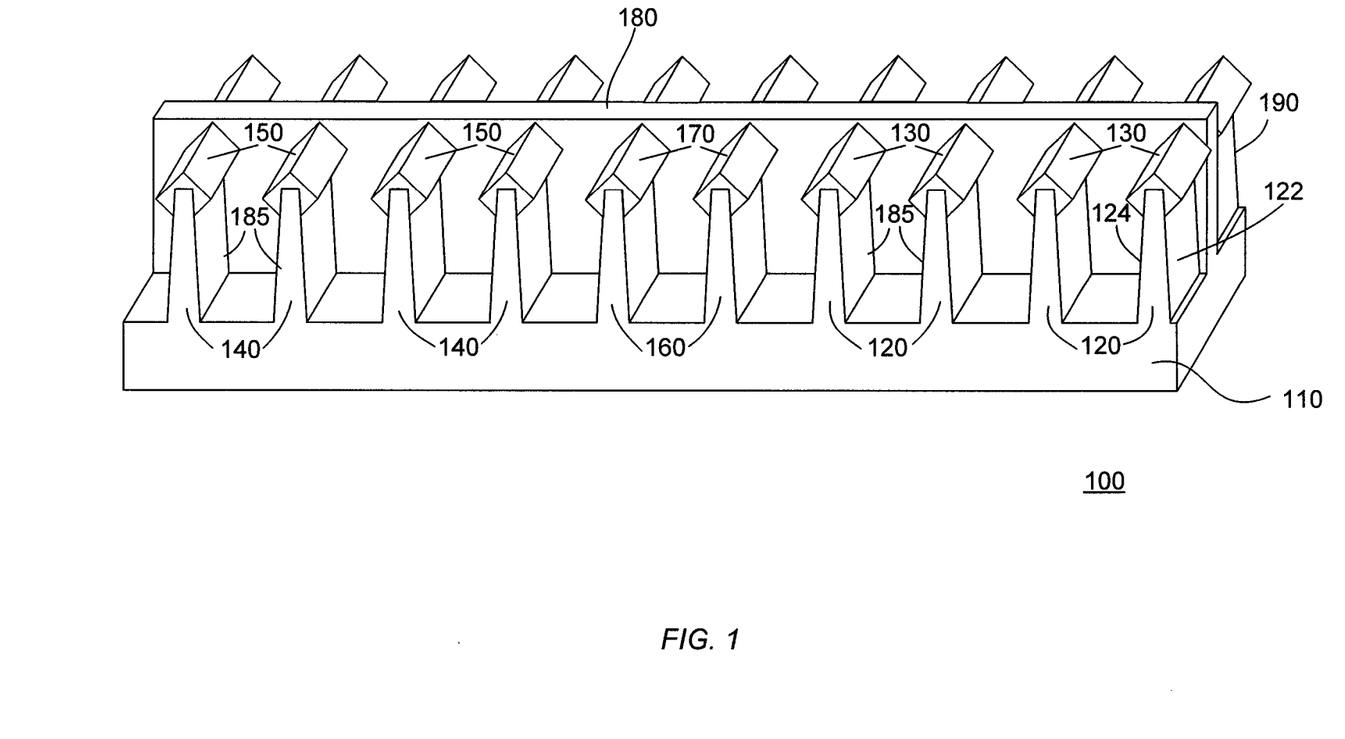
FIG. 1 is a cross-section of a first illustrative embodiment of a finFET of the invention.

FIG. 1 is a cross-section of a first illustrative embodiment of a finFET 100 of the invention. FinFET 100 comprises a substrate 110 of silicon, first, second and third pluralities of fins 120, 140, 160 that are formed on substrate 110 and integral therewith, silicon germanium regions 130 that are grown epitaxially on the first plurality of fins 120, silicon regions 150 that are grown epitaxially on the second plurality of fins 140, and silicon regions 170 that are grown epitaxially on the third plurality of fins 160. The number of fins in each plurality is only illustrative. There may be more fins or as few as one fin. Each of the fins has two major surfaces such as surfaces 122, 124 identified on one of fins 120. Gates 180 are formed on fins 120, 140, 160; and source and drain regions 185, 190 are formed on the epitaxial regions 130, 150, 170 so that first PMOS transistors are formed in epitaxial regions 130 on fins 120, NMOS transistors are formed in epitaxial regions 150 on fins 140 and second PMOS transistors are formed in epitaxial regions 170 on fins 160. As will be apparent from the description in FIG. 7 of an illustrative method for forming finFET 100, epitaxial regions 130, 150, 170 do not extend under gates 180.

Figure 2:
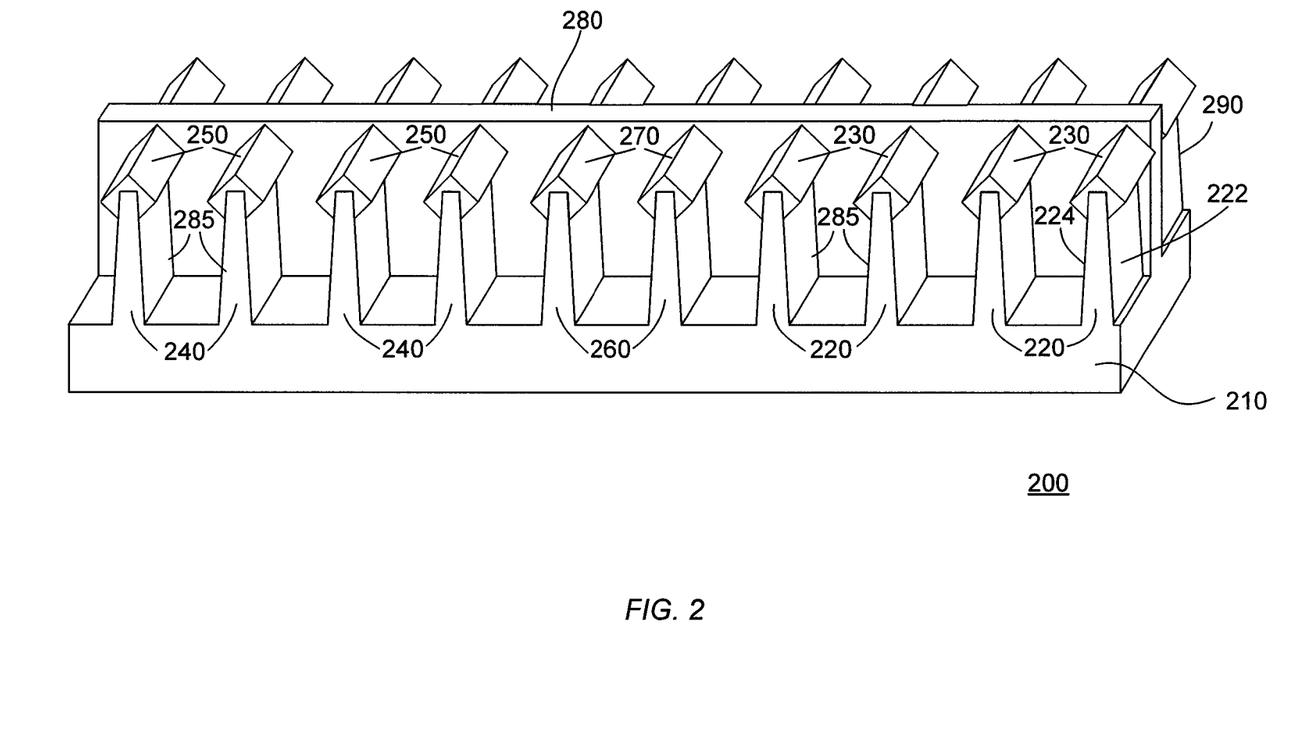
FIG. 2 is a cross-section of a second illustrative embodiment of a finFET of the invention.

FIG. 2 is a cross-section of a second illustrative embodiment of a finFET 200 of the invention. With one exception, finFet 200 is similar to finFET 100 and the elements of finFET 200 bear the same numbers increased by 100. FinFET 200 differs from finFET 100 in that silicon carbide regions 270 are grown epitaxially on fins 260. The amount of carbon in silicon carbide region 270 is less than approximately 2 percent (%) by weight of the weight of the silicon in region 270. The carbon may be incorporated in region 270 during epitaxial growth or may be implanted subsequent to epitaxial growth of the region. Again, there may be more fins in each plurality of fins 220, 240, 260 or as few as one.

Figure 3:
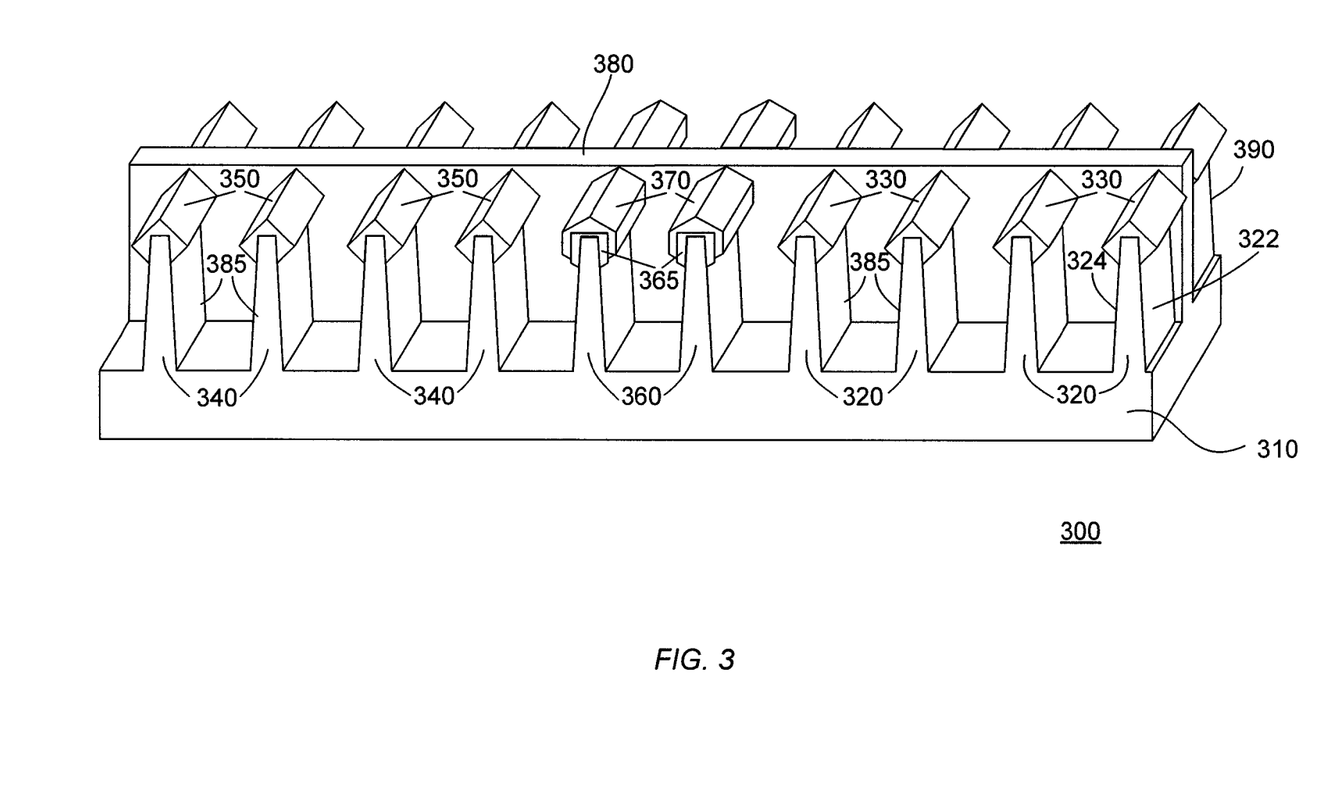
FIG. 3 is a cross-section of a third illustrative embodiment of a finFET of the invention.

FIG. 3 is a cross-section of a third illustrative embodiment of a finFET 300 of the invention. FinFet 300 is similar to finFET 100 and the elements of finFET 300 bear the same numbers increased by 200. FinFET 300 differs from finFET 100 in that silicon carbide cladding regions 365 are grown epitaxially on fins 360 and silicon or silicon carbide regions 370 are epitaxially grown on cladding regions 365. As will be apparent from the description of FIG. 7 of an illustrative method for forming finFET 100, cladding region 365 extends under gates 380 while epitaxial regions 330, 350, 370 formed on cladding region 365 do not. The amount of carbon in cladding region 365 or in silicon carbide region 370 is less than approximately 2 percent (%) by weight of the weight of the silicon in that region. Again, there may be more fins 320, 340, 360 in each plurality of fins or as few as one fin.

Figure 4:
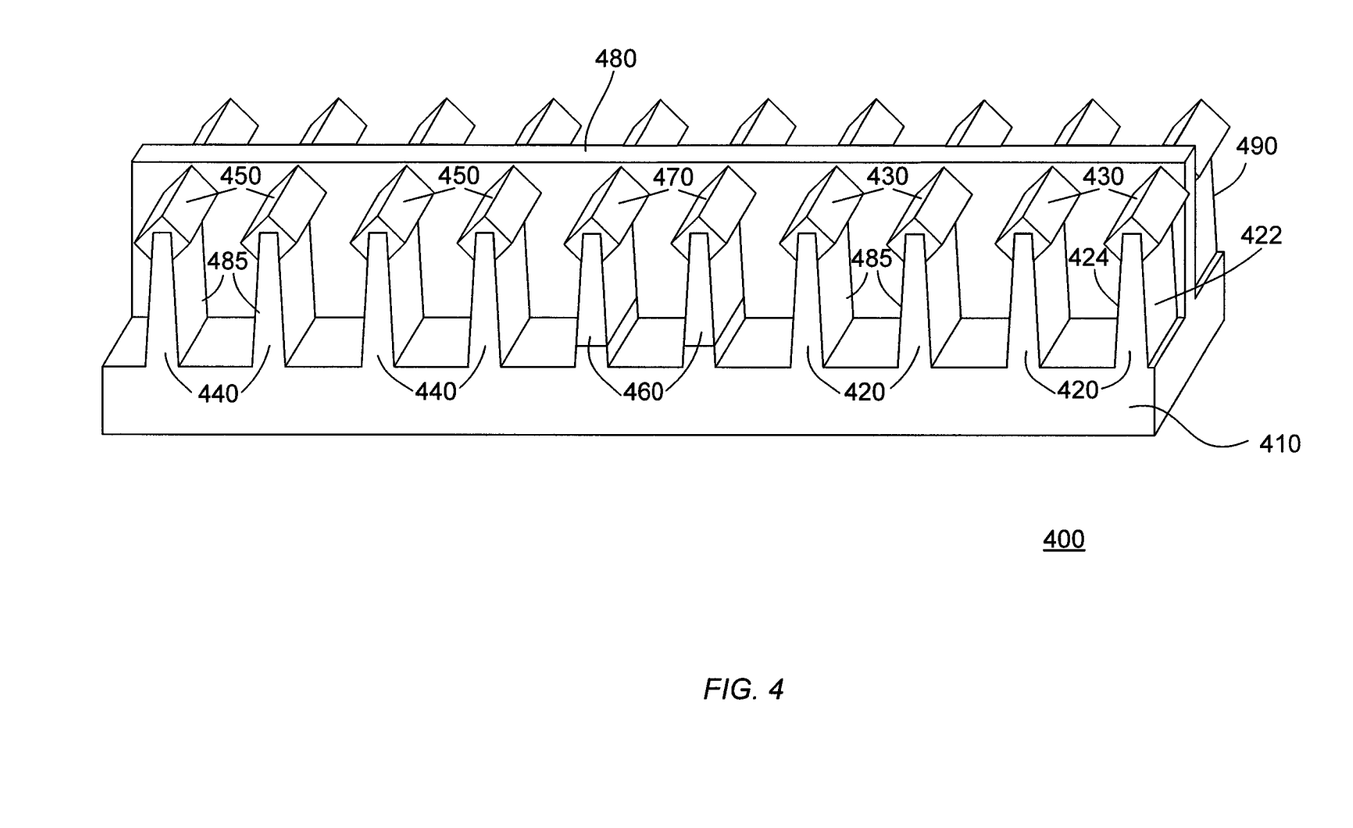
FIG. 4 is a cross-section of a fourth illustrative embodiment of a finFET of the invention.

FIG. 4 is a cross-section of a fourth illustrative embodiment of a finFET 400 of the invention. FinFet 400 is similar to finFET 100 and the elements of finFET 400 bear the same numbers increased by 300. FinFET 400 differs from finFET 100 in that third plurality of fins 460 is made of a wide band gap semiconductor material and epitaxial regions 470 are made of a wide band gap semiconductor material grown epitaxially on third plurality of fins 460. Again, there may be more fins in each plurality of fins 420, 440, 460 or as few as one fin.

For purposes of this application, the term wide band gap semiconductor material will be understood to include any semiconductor material having a band gap in excess of the band gap of silicon. Examples of such wide band gap semiconductor materials include silicon carbide, diamond, various III-V semiconductor materials such as the nitrides, and materials identified in FIG. 9 as having a band gap in excess of that of silicon.

Figure 5:
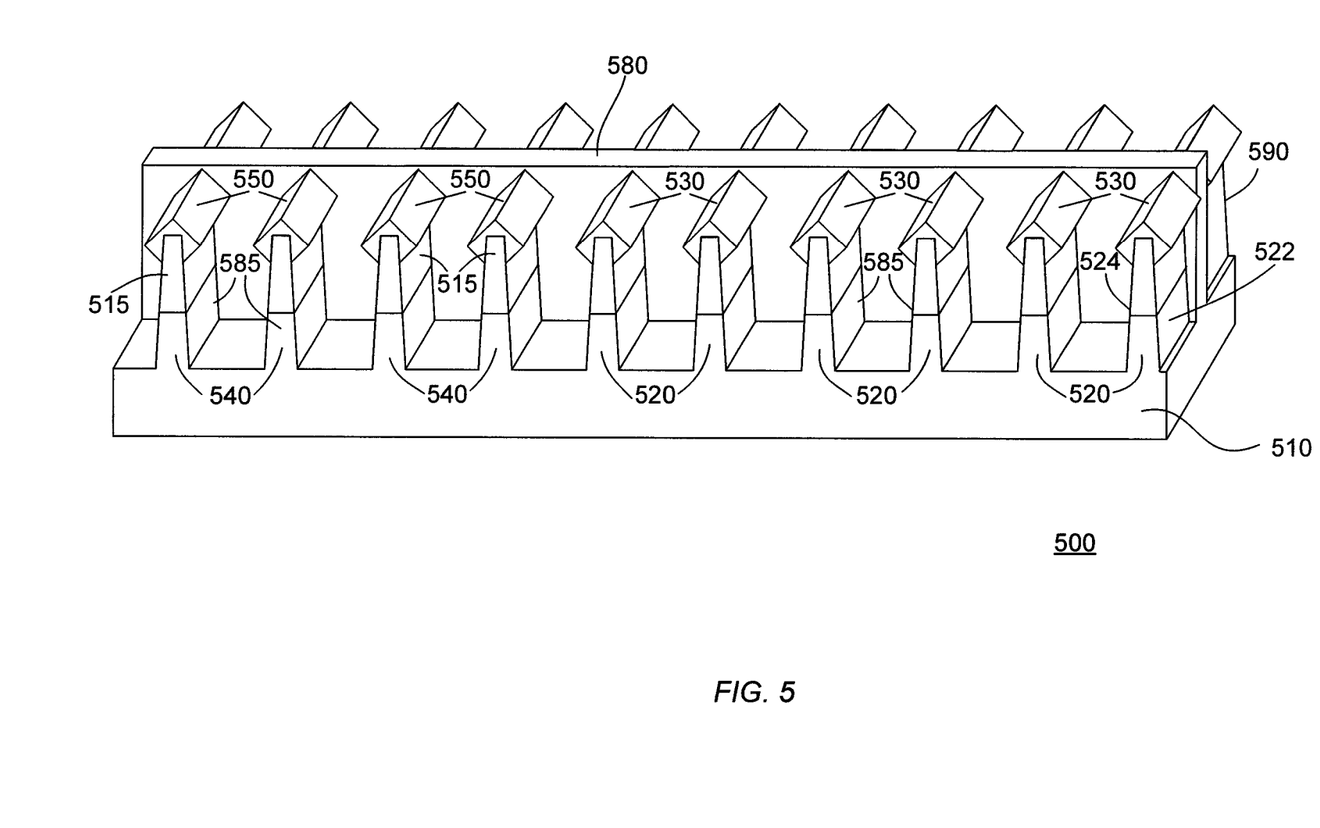
FIG. 5 is a cross-section of a fifth illustrative embodiment of a finFET of the invention.

FIG. 5 is a cross-section of a fifth illustrative embodiment of a finFET 500 of the invention. FinFet 500 comprises a substrate 510 of silicon, first and second pluralities of fins 520, 540 that are formed in a region 515 that is epitaxially grown on substrate 510 and integral therewith, first regions 530 that are grown epitaxially on the first plurality of fins 520 and second regions 550 that are grown epitaxially on the second plurality of fins 540. The number of fins in each plurality is only illustrative. There may be more fins or as few as one fin. Each of the fins has two major surfaces such as surfaces 522, 524 identified on one of fins 520. Gates 580 are formed on fins 520, 540; and source and drain regions 585, 590 are formed on the epitaxial regions 530, 550 so that PMOS transistors are formed in epitaxial regions 530 on fins 520 and NMOS transistors are formed in epitaxial regions 550 on fins 540. As will be apparent from the description in FIG. 8 of an illustrative method for forming finFET 500, epitaxial regions 530, 550 do not extend under gates 580.

Figure 6:
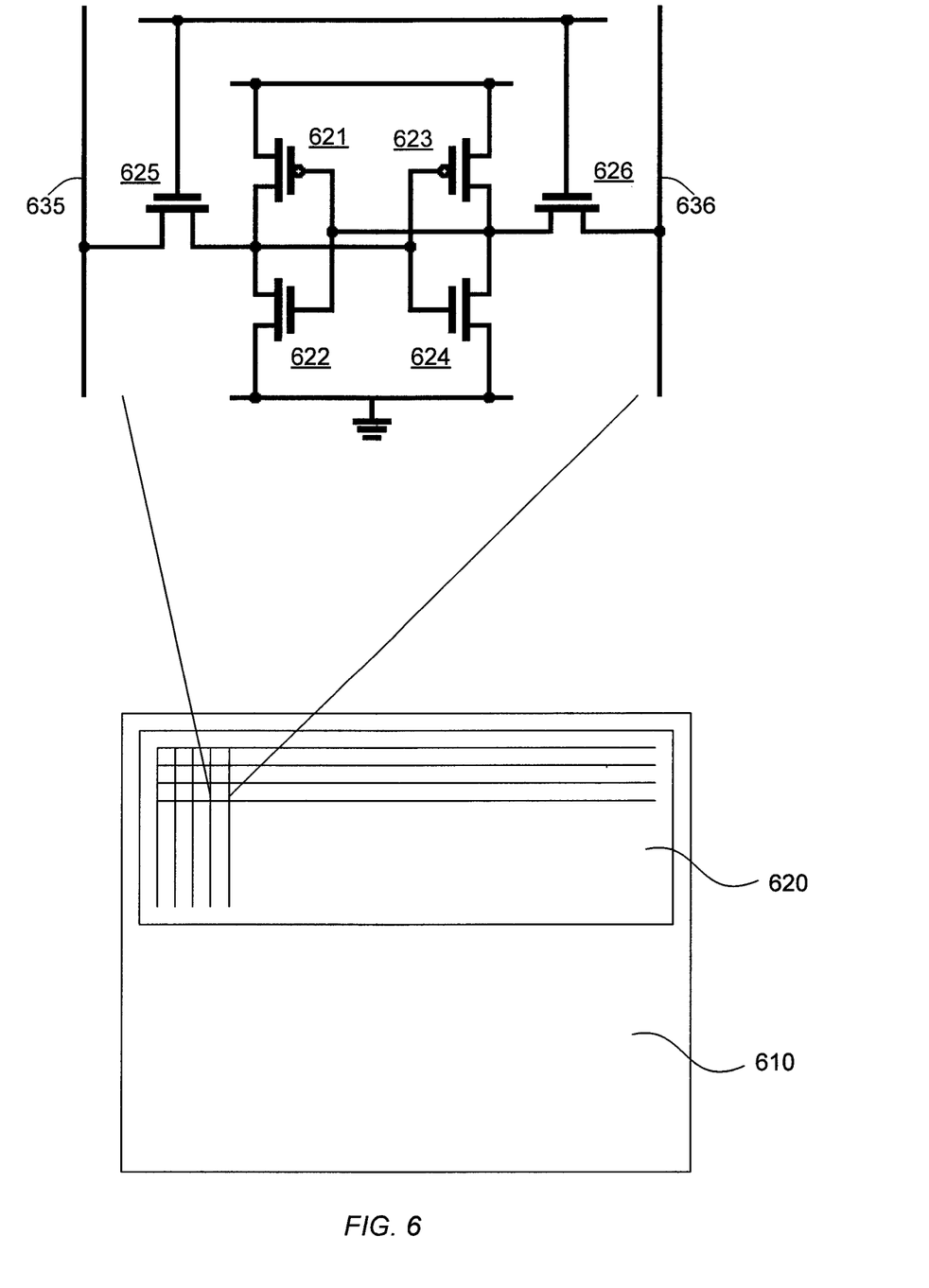
FIG. 6 is a schematic diagram depicting a field programmable gate array and its configuration memory.

We have found that second PMOS transistors of finFETS 100, 200, 300, 400 and the PMOS transistors of finFET 500 have leakage currents that are significantly lower than the leakage current of similar silicon germanium PMOS finFETs. One application for such PMOS transistors is in the six transistor static RAM cells that are used, for example, to store the configuration bits that configure FPGAs. FIG. 6 is a schematic diagram depicting an FPGA 610, its configuration RAM 620 and one cell of the configuration RAM. As shown in FIG. 6, the cell comprises a latch having a first pair of series-connected PMOS and NMOS transistors 621, 622 cross-coupled with a second pair of series-connected PMOS and NMOS transistors 623, 624 and NMOS pass transistors 625, 626 for connecting the latch to the bit lines 635, 636. Since a configuration RAM in present day technologies may include millions of static RAM cells, a substantial reduction in the leakage current of the PMOS transistors used in such cells is of great value. By using two types of PMOS finFET transistors, transistors such as the first PMOS transistors can be optimized for high speed operation; and transistors such as the second PMOS transistors can be optimized for low leakage and used in the CRAM where speed of operation is not as demanding.

Figure 7:
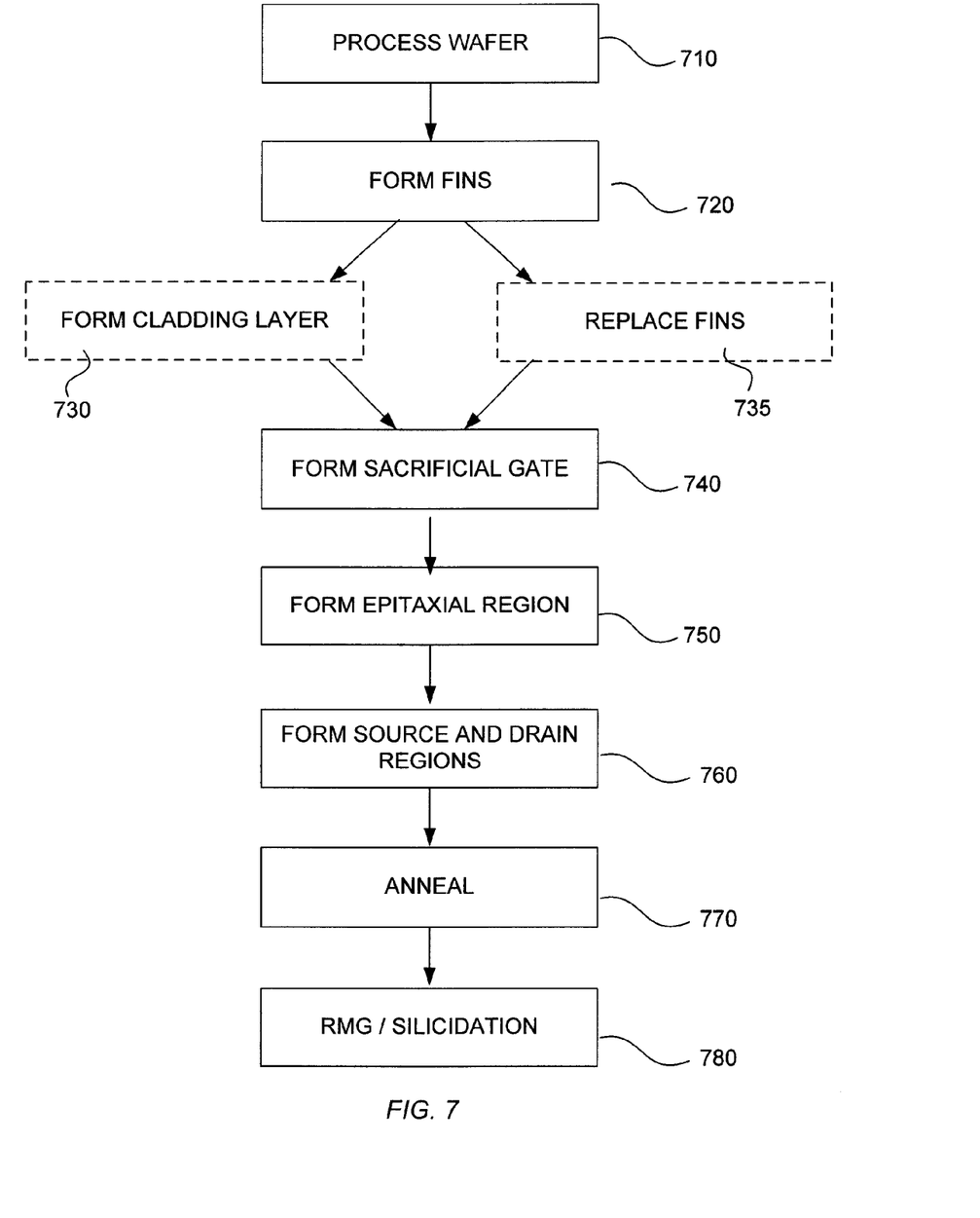
FIG. 7 is a flow chart depicting a first illustrative embodiment of the method of the invention.

FIG. 7 is a flow chart depicting illustrative processes for forming the semiconductor structures of FIGS. 1-4. Steps that are common to the fabrication of all four embodiments are outlined with solid lines. Steps that are not used in fabricating all four embodiments are outlined by dotted lines.

Illustratively, the process is performed on a wafer of semiconductor material such as monocrystalline silicon that may be up to 12 inches (300 mm.) in diameter in today's state-of-the-art processes. Typically, numerous identical integrated circuits are formed simultaneously in the wafer, each of which circuits includes one or more finFET circuit structures of the type described herein. After processing of the wafer is completed, the wafer is broken apart into individual integrated circuit die.

The process begins at step 710 with processing of the wafer to form well regions and other basic features of the circuits.

At step 720, fins are formed in the silicon substrate of the wafer. The fins are integral with the wafer in which they are formed, are substantially parallel to one another, and advantageously are spaced apart by approximately the minimum line-width achievable with the technology used to form them.

The fins have first and second opposing major surfaces and, illustratively are identical to those that would be formed in making conventional finFETs. While the first and second opposing major surfaces are often illustrated as being parallel to each other, it will be understood that process limitations often result in a structure in which the first and second major surfaces slope outwardly from top to bottom of the segment so that the cross-section of the segment is trapezoidal in shape.

There are numerous ways to form the fins of a FinFET. Illustratively, a plurality of parallel, spaced-apart linear elements is formed on the surface of the silicon wafer where the finFETs are to be formed. Illustratively, the linear elements are strips of silicon dioxide. The linear elements are approximately rectangular in cross-section and have a width that is approximately the desired spacing between adjacent fins of the finFET. Typically, this spacing is the minimum line-width achievable.

Spacers are then formed on the sides of the linear elements. Illustratively, a layer of appropriate material such as silicon nitride is deposited on the linear elements and the exposed surface of the silicon; and this layer is then anisotropically etched to remove all of the deposited layer down to the upper surfaces of the linear elements and the silicon except for narrow spacer regions on the sides of the linear elements.

The linear elements are then removed, thereby exposing the semiconductor material between the spacers. The spacers are then used as hard masks in an etching process that removes the silicon except for the material underlying the spacers, thereby forming channels in the silicon that define a plurality of fins.

Steps 730 and 735 are alternative steps employed in fabricating the embodiments of FIGS. 3 and 4. In the case of the embodiment of FIG. 3, a silicon carbide cladding layer is formed at step 730 on the surface of the fins by epitaxially growing this layer on the surfaces of the fins. Carbon may be incorporated in the cladding region during epitaxial growth of the region or may be implanted subsequent to epitaxial growth of the region.

In the case of the embodiment of FIG. 4, the silicon fins on which the second PMOS transistors would otherwise be formed are replaced at step 735 with fins made of a wide band gap semiconductor material. Illustratively, silicon carbide fins may be formed by implanting carbon in the silicon fins that are to be replaced. Alternatively, oxide regions can be formed around the silicon fins that are to be replaced, the fins can be removed by etching using an etchant that is selective for silicon, thereby leaving a plurality of fin shaped holes in the oxide, and fins of a wide band gap semiconductor material can then be epitaxially grown on the silicon at the bottom of the holes.

At step 740, a sacrificial gate structure is formed that extends across the fins in a direction substantially perpendicular to the ridges and valleys of the fins. Processes for forming such a gate structure are well known. Illustratively, an oxide layer is first formed on the fins; and a layer of a suitable material such as polysilicon is then formed on the oxide layer. The polysilicon and oxide layers are then shaped to form the desired sacrificial gate structure. Typically spacers are then formed on the sidewalls of the gate.

At step 750, epitaxial regions are then formed on the fins. Illustratively, in the case of the first and second embodiments depicted in FIGS. 1 and 2, a mask is formed on everything but the first plurality of fins; and silicon germanium regions are then grown epitaxially on the first plurality of fins. The first plurality of fins is then masked.

In the case of fabrication of the first embodiment, the mask is then removed from the second and third pluralities of fins; and silicon regions are then grown epitaxially on the second and third pluralities of fins.

In the case of fabrication of the second embodiment, the mask is removed from the second plurality of fins and silicon regions are then grown epitaxially on the second plurality of fins. The second plurality of fins is then masked; and the mask is removed from the third plurality of fins. Silicon carbide regions are then grown epitaxially on the third plurality of fins.

In the case of the fabrication of the third embodiment depicted in FIG. 3, the epitaxial regions are formed using the same steps as described above for the first or second embodiments but the epitaxial regions are grown on the cladding region instead of directly on the fins.

In the case of fabrication of the fourth embodiment depicted in FIG. 4, a mask is formed on everything but the first plurality of fins; and silicon germanium regions are then grown epitaxially on the first plurality of fins. The first plurality of fins is then masked. The mask is removed from the second plurality of fins and silicon regions are then grown epitaxially on the second plurality of fins. The second plurality of fins is then masked; and the mask is removed from the third plurality of fins. Wide band gap semiconductor regions are then grown epitaxially on the third plurality of wide band gap fins 460.

At step 760, source and drain regions are then formed in the epitaxial regions on the first, second and third pluralities of fins. A first mask is formed over the portion of the finFET where the first and second PMOS transistors are to be located. NMOS transistors are then formed by ion implantation of N-type dopants such as arsenic to form N-type source and drain regions on the epitaxial regions on the major surfaces of the fins on the sides of the gate that are not protected by the first mask. The first mask is then removed and a second mask is formed over the portion of the finFET where the N-type source and drain regions were just formed. First and second PMOS transistors are then formed by ion implantation of P-type dopants such as boron to form P-type source and drain regions on the major surfaces of the fins on the sides of the gate that are not protected by the second mask. The second mask is then removed.

As an alternative to implanting the p-type dopants, it may be advantageous to incorporate the dopants in situ in the epitaxial regions when the epitaxial regions are being grown.

At step 770, the wafer is annealed.

At step 780, in a replacement metal gate (RMG) process, the dummy gate and oxide are replaced with a metal gate and a high-k dielectric. Silicidation may also be performed to reduce source/drain resistance and/or gate resistance. At this point, the fabrication of the finFET is complete although other processes may remain to be performed on other parts of the integrated circuit. Finally, the circuits on the wafer are separated into individual integrated circuit die.

Figure 8:
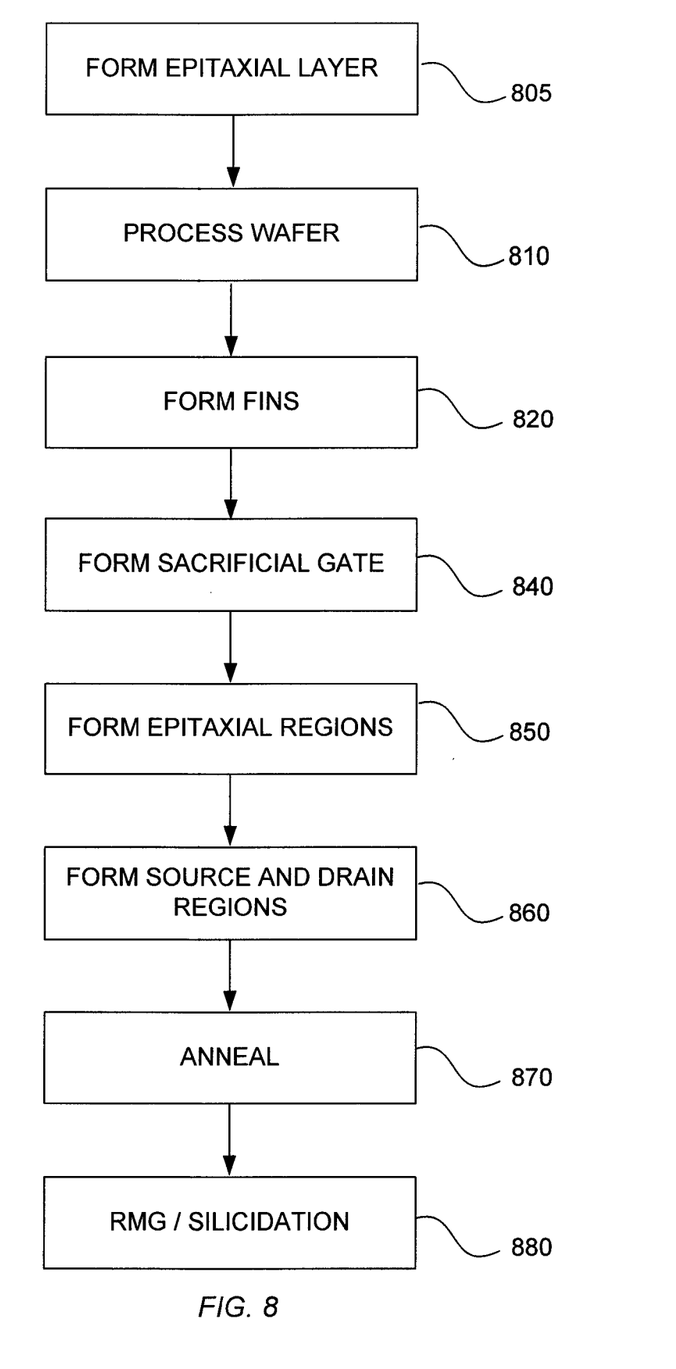
FIG. 8 is a flow chart depicting a second illustrative embodiment of the method of the invention.

FIG. 8 is a flow chart depicting illustrative processes for forming the semiconductor structures of FIG. 5. Illustratively, the process is performed on a wafer of semiconductor material such as monocrystalline silicon that may be up to 12 inches (300 mm.) in diameter in today's state-of-the-art processes. Typically, numerous identical integrated circuits are formed simultaneously in the wafer, each of which circuits includes one or more finFET circuit structures of the type described herein. After processing of the wafer is completed, the wafer is broken apart into individual integrated circuit die.

The process begins at step 805 with the epitaxial growth of a layer of a wide band gap semiconductor material on the surface of the silicon wafer. The layer is made thick enough to permit formation of fins made of the wide band gap material.

At step 810 the wafer is processed to form well regions and other basic features of the circuits.

At step 820, fins are formed in the epitaxial layer of a wide band gap material on the wafer. The process is substantially the same as that described for step 720 with adjustments for the use of different materials.

At step 840, a sacrificial gate structure is formed that extends across the fins in a direction substantially perpendicular to the ridges and valleys of the fins. Processes for forming such a gate structure are well known.

At step 850, epitaxial regions are then formed on the fins.

At step 860, source and drain regions are then formed in the epitaxial regions on the first and second pluralities of fins. A first mask is formed over the portion of the finFET where the first and second PMOS transistors are to be located. NMOS transistors are then formed by ion implantation of N-type dopants such as arsenic to form N-type source and drain regions on the epitaxial regions on the major surfaces of the fins on the sides of the gate that are not protected by the first mask. The first mask is then removed and a second mask is formed over the portion of the finFET where the N-type source and drain regions were just formed. PMOS transistors are then formed by ion implantation of P-type dopants such as boron to form P-type source and drain regions on the major surfaces of the fins on the sides of the gate that are not protected by the second mask. The second mask is then removed.

At step 870, the wafer is annealed.

At step 880, in an RMG process, the dummy gate and oxide are replaced with a metal gate and a high-k dielectric. Silicidation may also be performed to reduce source/drain resistance and/or gate resistance. At this point, the fabrication of the finFET is complete although other processes may remain to be performed on other parts of the integrated circuit. Finally, the circuits on the wafer are separated into individual integrated circuit die.

Figure 9:
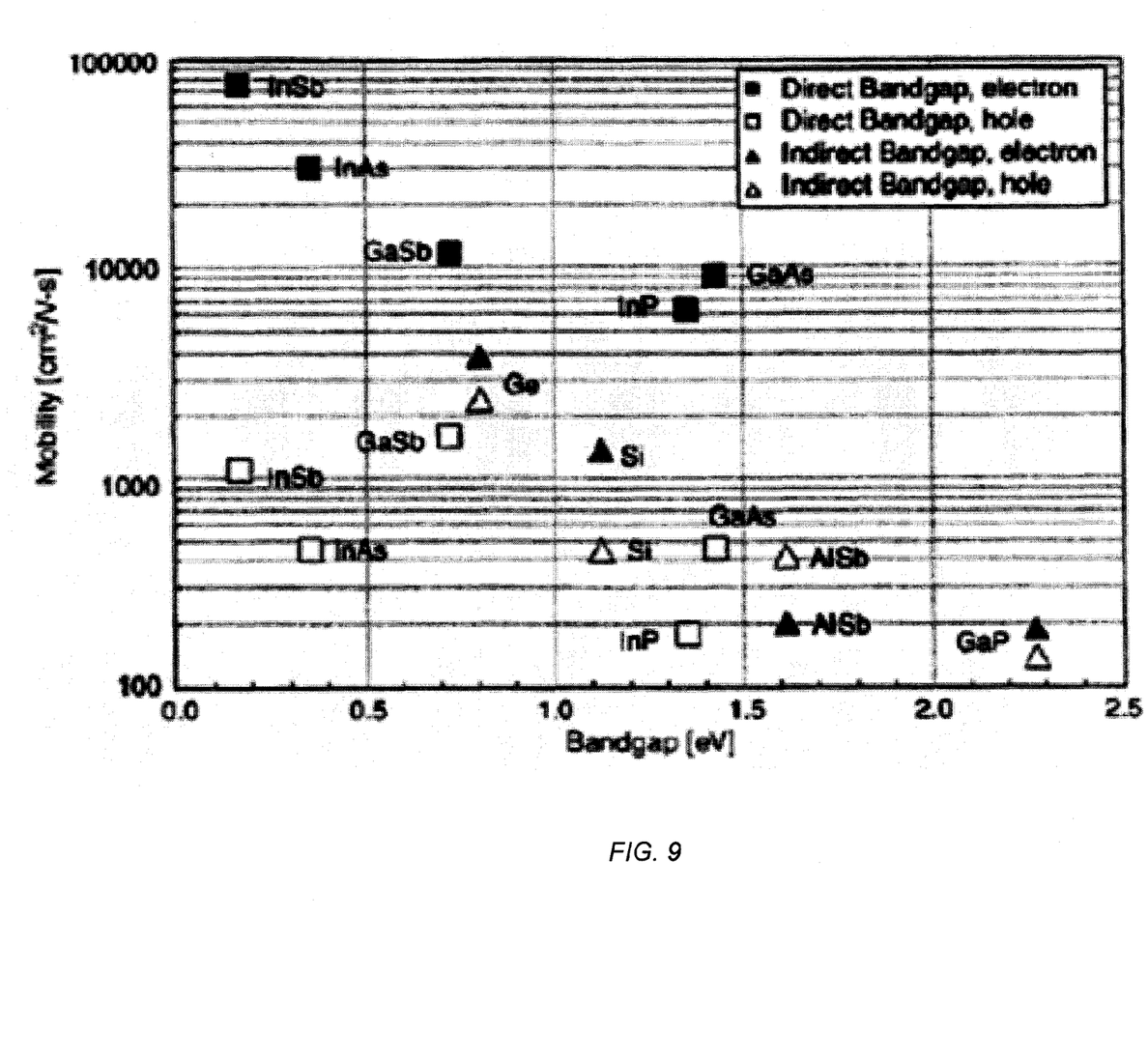
FIG. 9 is a chart depicting electron and hole mobility versus band gap for various semiconductors.

As will be apparent to those skilled in the art, numerous variations may be practiced within the spirit and scope of the present invention. For example, numerous semiconductor materials may be used in the practice of the invention. FIG. 9 is a chart depicting the electron and hole mobilities versus bandgap for silicon, germanium and a variety of III-V compounds. Many other III-V compounds not identified on the chart but well known in the art may also be used. While one process has been described for the formation of the finFETs, other processes may also be used; and numerous variations in these processes may also be practiced. Different materials may be used as cap layers, mask layers, spacers, and the like; and a wide variety of etchants and etching processes may be used to remove these materials. In the interest of brevity and to avoid obscuring the invention, many details of conventional processes for forming finFETs have been left out.

What is claimed is:

1. A finFET comprising:
   at least a first fin;
   a first epitaxial region formed on the first fin;
   a first PMOS transistor formed in the first epitaxial region on the first fin;
   at least a second fin;
   a second epitaxial region formed on the second fin;
   a NMOS transistor formed in the second epitaxial region on the second fin;
   at least a third fin;
   a third epitaxial region formed on the third fin; and
   a second PMOS transistor formed in the third epitaxial region on the third fin, the third epitaxial region being made of a semiconductor material having a band gap equal to or greater than that of silicon; and
   a cladding region epitaxially formed on the third fin, the third epitaxial region being formed on the cladding region.

2. The finFET of claim 1 wherein the fins are made of silicon.

3. The finFET of claim 2 wherein the first epitaxial region is made of silicon germanium.

4. The finFET of claim 2 wherein the second epitaxial region is made of silicon.

5. The finFET of claim 2 wherein the third epitaxial region is made of silicon.

6. The finFET of claim 2 wherein the third epitaxial region is made of silicon carbide.

7. The finFET of claim 2 wherein the first epitaxial region is made of silicon germanium, the second epitaxial region is made of silicon, and the third epitaxial region is made of silicon or a wide band gap semiconductor material.

8. The finFET of claim 1 wherein the third fin is made of a wide band gap semiconductor material and the third epitaxial region is made of a wide band gap semiconductor material.

9. The finFET of claim 1 wherein the cladding region is formed of silicon or silicon carbide and the third epitaxial region is formed of silicon or silicon carbide.

10. A finFET comprising:
    at least a first fin;
    a first epitaxial region formed on the first fin;
    a first PMOS transistor formed in the first epitaxial region on the first fin;
    at least a second fin;
    a second epitaxial region formed on the second fin;
    a NMOS transistor formed in the second epitaxial region on the second fin;
    at least a third fin;
    a third epitaxial region formed on the third fin; and a second PMOS transistor formed in the third epitaxial region on the third fin, the third epitaxial region being made of a semiconductor material that is different from that of the first epitaxial region.

11. The finFET of claim 10 wherein the semiconductor material of the third epitaxial region has a band gap that is greater than that of silicon.

12. The finFET of claim 10 wherein the second epitaxial region is made of silicon.

13. A method for forming a finFET comprising:
forming at least first, second and third fins;
forming a first epitaxial region on the first fin;
forming a second epitaxial region on the second fin;
epitaxially forming a cladding region on the third fin;
forming a third epitaxial region on the cladding region, the third epitaxial region being made of a semiconductor material having a band gap equal to or greater than that of silicon;
forming a first PMOS transistor in the first epitaxial region;
forming a NMOS transistor in the second epitaxial region; and
forming a second PMOS transistor in the third epitaxial region.

14. The method of claim 13 wherein the fins are made of silicon.

15. The method of claim 13 wherein the first epitaxial region is made of silicon germanium.

16. The method of claim 13 wherein the first epitaxial region is made of silicon germanium, the second epitaxial region is made of silicon, and the third epitaxial region is made of silicon or a wide band gap semiconductor material.

17. The method of claim 13 wherein the third fin is made of a wide band gap semiconductor material and the third epitaxial region is made of a wide band gap semiconductor material.

18. A method for forming a finFET comprising:
forming at least first and second fins;
forming a first epitaxial region on the first fin;
forming a second epitaxial region on the second fin;
forming a first PMOS transistor in the first epitaxial region;
forming a NMOS transistor in the second epitaxial region;
forming at least a third fin;
forming a third epitaxial region on the third fin; and
forming a second PMOS transistor in the third epitaxial region on the third fin, the third epitaxial region being made of a semiconductor material different from that of the first epitaxial region and having a band gap equal to or greater than that of silicon.

19. A finFET comprising:
at least a first fin;
a first epitaxial region formed on the first fin;
a first PMOS transistor formed in the first epitaxial region on the first fin;
at least a second fin;
a second epitaxial region formed on the second fin;
a NMOS transistor formed in the second epitaxial region on the second fin;
at least a third fin;
a third epitaxial region formed on the third fin; and
a second PMOS transistor formed in the third epitaxial region on the third fin, the third epitaxial region being made of a semiconductor material different from that of the first epitaxial region and having a band gap equal to or greater than that of silicon.

20. The finFET of claim 19 wherein the fins are made of silicon.

21. The finFET of claim 20 wherein the first epitaxial region is made of silicon germanium.

22. The finFET of claim 20 wherein the second epitaxial region is made of silicon.

23. The finFET of claim 20 wherein the third epitaxial region is made of silicon or silicon carbide.

24. The finFET of claim 19 further comprising a cladding region epitaxially formed on the third fin, the third epitaxial region being formed on the cladding region.

25. The finFET of claim 24 wherein the cladding region is formed of silicon or silicon carbide and the third epitaxial region is formed of silicon or silicon carbide.

* * * * *